United States Patent
Brooks et al.

(10) Patent No.: US 6,329,890 B1
(45) Date of Patent: Dec. 11, 2001

(54) MODULAR THIN FILM DISTRIBUTED FILTER

(75) Inventors: Mark Brooks, North Mankato; Mark Hamilton Broman, Mankato, both of MN (US)

(73) Assignee: Thin Film Technology Corp., North Mankato, MN (US)

( * ) Notice: Subject to any disclaimer, the term of this patent is extended or adjusted under 35 U.S.C. 154(b) by 0 days.

(21) Appl. No.: 09/676,856

(22) Filed: Sep. 29, 2000

Related U.S. Application Data

(63) Continuation-in-part of application No. 09/257,451, filed on Feb. 25, 1999, now Pat. No. 6,127,906.

(51) Int. Cl.⁷ .............................. H01P 1/20; H03H 7/00
(52) U.S. Cl. ........................ 333/204; 333/205; 333/175
(58) Field of Search ...................................... 333/202, 204, 333/205, 175, 185, 238

(56) References Cited

U.S. PATENT DOCUMENTS 5,644,275 * 7/1997 Ishizaki et al. ..................... 333/204
5,859,473 * 1/1999 Ikata et al. .......................... 333/132
5,892,415 * 4/1999 Okamura .............................. 333/185
6,133,809 * 10/2000 Tomohiro et al. ................... 333/185

* cited by examiner

*Primary Examiner*—Robert Pascal
*Assistant Examiner*—Patricia Nguyen
(74) *Attorney, Agent, or Firm*—D. L. Tschida

(57) ABSTRACT

Modular thin film, distributed, lumped element band-pass filters. The filter circuitry is configured on a number of ceramic substrates. The component defining depositions are arranged to overlap and couple to one another with connecting vias. Alternative band-pass filter and delay line circuits are disclosed that provide desirable delay characteristics. Bordering ground conductors and covering ground planes shield lumped impedance resonator and overlapping capacitor elements and/or provide a hermetic seal between the layers. The assemblies are configured to accommodate a range of frequencies and permit pre-fabrication with subsequent laser trimming, assembly and packaging.

6 Claims, 13 Drawing Sheets

MODULAR THIN FILM DISTRIBUTED FILTER

RELATED APPLICATIONS

The present application is a continuation-in-part of application Ser. No. 09/257,451, filed Feb. 25, 1999, now U.S. Pat. No. 6,127,906.

BACKGROUND OF THE INVENTION

The present invention relates to high frequency filters and, in particular, to a distributed, thin film lumped element band-pass filter theoretically capable of operation at frequencies in the range of 800 MHz to 10.0 GHz.

Varieties of thin film devices have been constructed for high frequency circuits. Most have been directed to microwave applications. Some devices, such as discrete delay line assemblies, have been constructed for higher frequency applications. Delay lines are frequently used to adjust timing inconsistencies at complex circuitry mounted to complex printed circuit boards. Examples of some discrete, multi-layer, delay line devices constructed on ceramic substrates are shown at U.S. Pat. Nos. 5,030,931; 5,365,203; and 5,499,442.

The subject invention provides a discrete, distributed, lumped element, thin film band pass filter. Alternative multi-layer, filter configurations are constructed on ceramic substrates between shielding layers. Resonator, strip line, grounding and necessary termination layers are connected with solder filled vias that extend between the substrates and interconnect elements at the layers.

SUMMARY OF THE INVENTION

It is a primary object of the present invention to provide a shielded, band-pass filter capable of operation at frequencies in the range of 800 MHz to 10.0 GHz It is a further object of the invention to provide alternative band-pass filter circuits constructed from lumped, thin film components deposited on ceramic substrates.

It is a further object of the invention to provide shielded multi-layer filter circuits, wherein the layers are connected with through vias, and wherein various thin film depositions define lumped impedance circuit components, capacitors at overlapping strip conductors, strip conductors and terminations.

Various of the foregoing objects, advantages and distinctions of the invention can be found in alternative thin film band-pass filter circuits constructed on ceramic substrates. Circuit elements are constructed with discrete and overlapping thin film depositions. The surface area and thickness of the elements are tailored to desired operating characteristics of the circuit. Filled through vias electrically couple the layers and components together and to circuit terminations.

The layers can be pre-processed to determined configurations that permit a range of device characteristics. Specific circuit performance can be obtained by laser trimming the thin film depositions to specific shapes and dimensions, prior to stacking a number of prepared layers and final processing the layers into a desired filter device.

Still other objects, advantages and distinctions of the invention will become more apparent from the following description with respect to the appended drawings. To the extent alternative constructions, improvements or modifications have been considered they are described as appropriate. The description should not be literally construed in limitation of the invention. Rather, the scope of the invention should be broadly interpreted within the scope of the further appended claims.

BRIEF DESCRIPTION OF THE DRAWINGS

Like reference numerals refer to like structure at the various drawings and which are as follows.

DESCRIPTION OF THE PREFERRED EMBODIMENT

Figure 1:
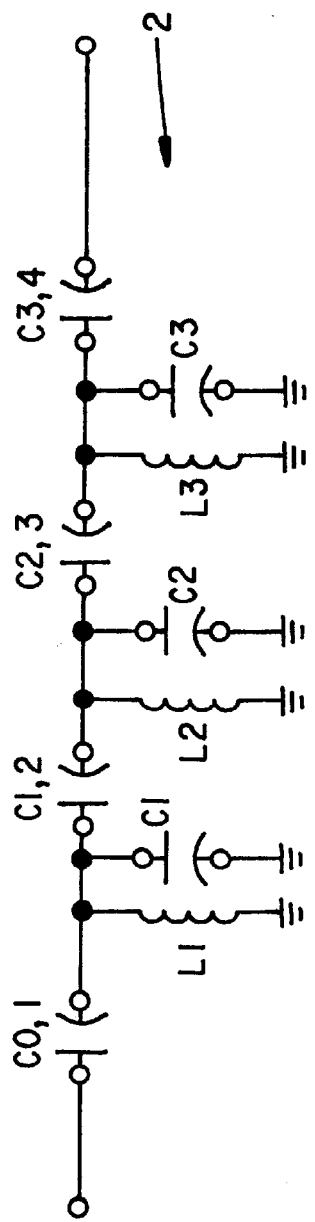
FIG. 1 is a circuit diagram to an exemplary narrow band-pass filter transform of the invention.
Figure 2:
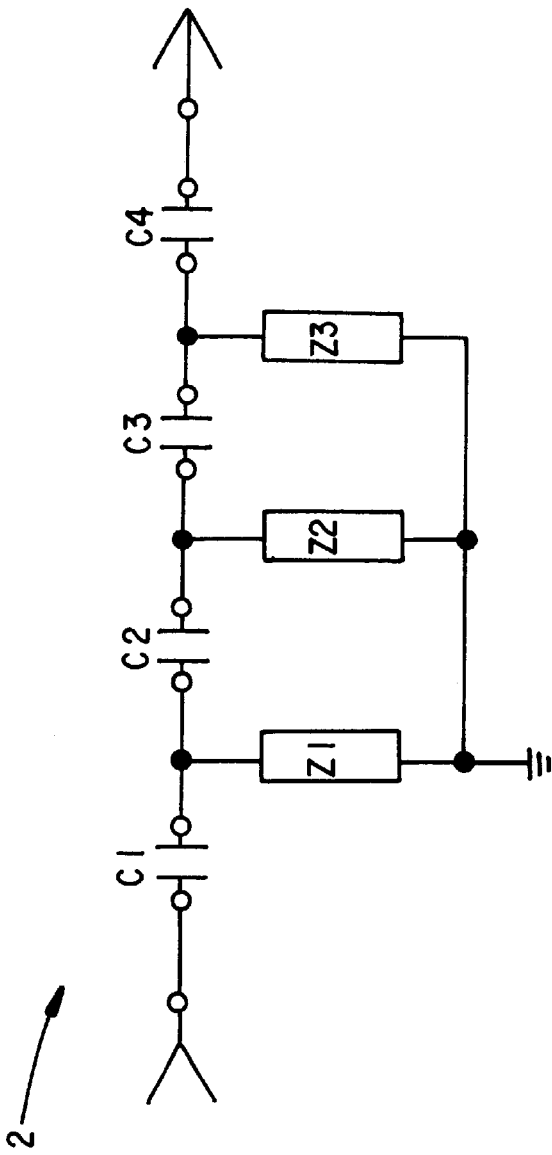
FIG. 2 is a circuit diagram of a distributed lumped impedance device that is equivalent to the circuit of FIG. 1.

Referring to FIGS. 1 and 2, generalized circuit diagrams are shown to the distributed thin film band-pass filter circuit 2 of the invention as constructed from discrete and distributed, lumped impedance components. The discrete coupling capacitors C0,1 through C3,4 and inductor and capacitor components L1–L3, C1–C3 of FIG. 1 are shown as lumped resonance determining components Z1(L1,C1), Z2(L2,C2) and Z3(L3,C3) at FIG. 2. The components of FIG. 2 are constructed from tailored thin film depositions that exhibit desired lumped impedances Z1, Z2 and Z3 at the operating frequency range.

The filter circuit 2 can be constructed to operate at various frequencies and operating characteristics, depending upon the dimensions of the various depositions that define the circuit elements. The elements Z1, Z2 and Z3 are defined by single thin film depositions. The discrete coupling capacitors C1 through C4 are determined by overlapping depositions at adjacent substrates. Necessary ground planes are defined with large depositions that substantially cover, overlying and underlying substrate surfaces. Dielectric materials are positioned between the substrates and passivation materials cover the stacked assemblies.

Figure 3:
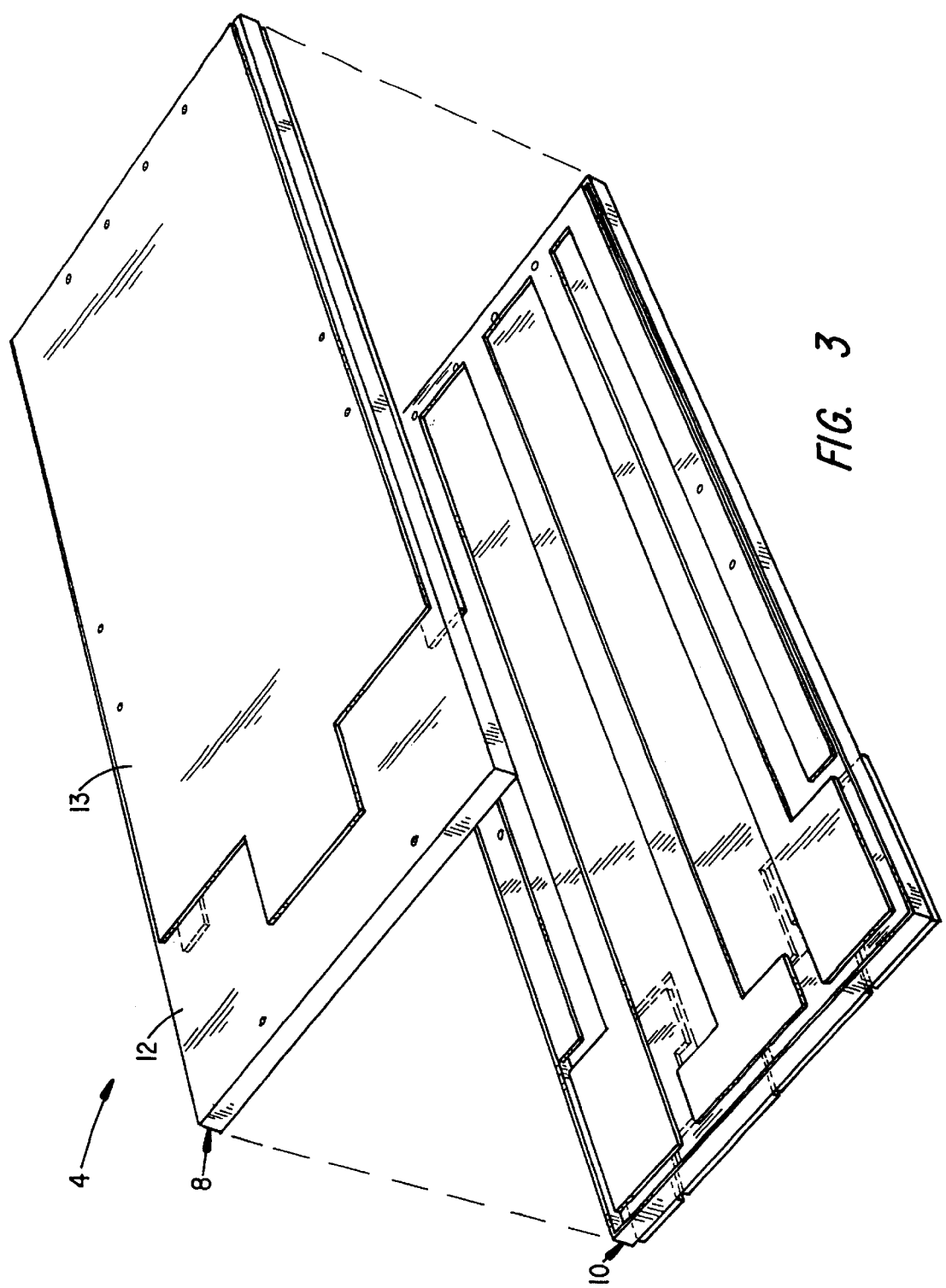
FIG. 3 is a perspective view, shown in exploded assembly, of a ground and lower lying strip line cover layer (shown in dashed line) and a resonator and bottom termination layer (shown in dashed line) of a 1.9 GHz band-pass filter.
Figure 9:
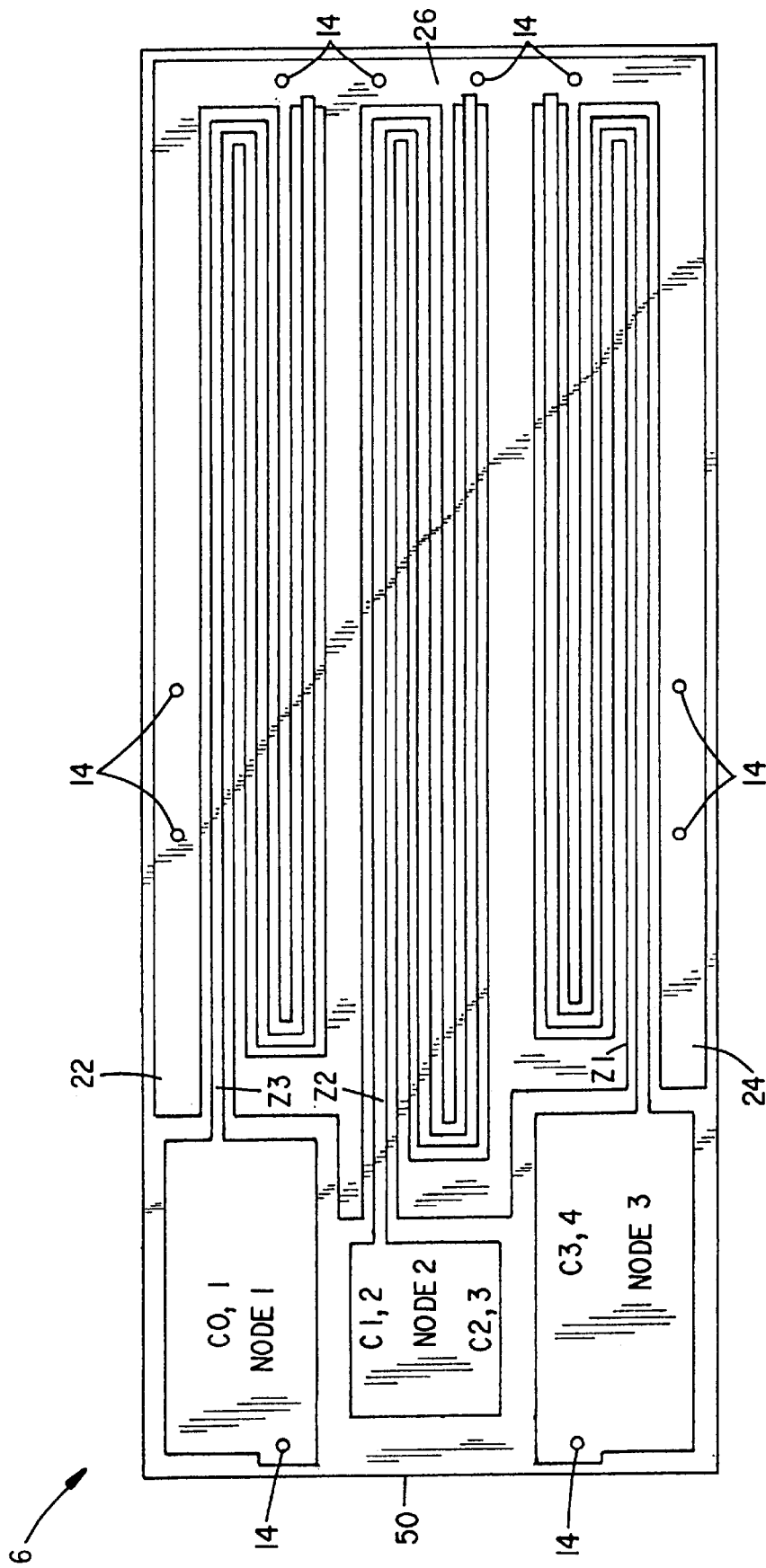
FIG. 9 is a plan view of a resonator layer of an 800 MHz filter.

FIG. 3 depicts a band-pass filter centered at 1.95 GHz. The filter circuit 6 of FIG. 9 is centered at 850 MHz. The nominal values of the circuit components vary with the center and side band frequencies and other operating characteristics of a desired filter. For example, the discrete values of the circuit elements of the filter 6 at FIG. 9 are C1=1.1 pf; C2 and C3=0.3 pf; and C4=1.25 pf. The dimensions of the lumped impedance depositions Z1, Z2 and Z3 are width=0.1 mm; length=25.57 mm; and thickness=0.535 mm.

Figure 7:
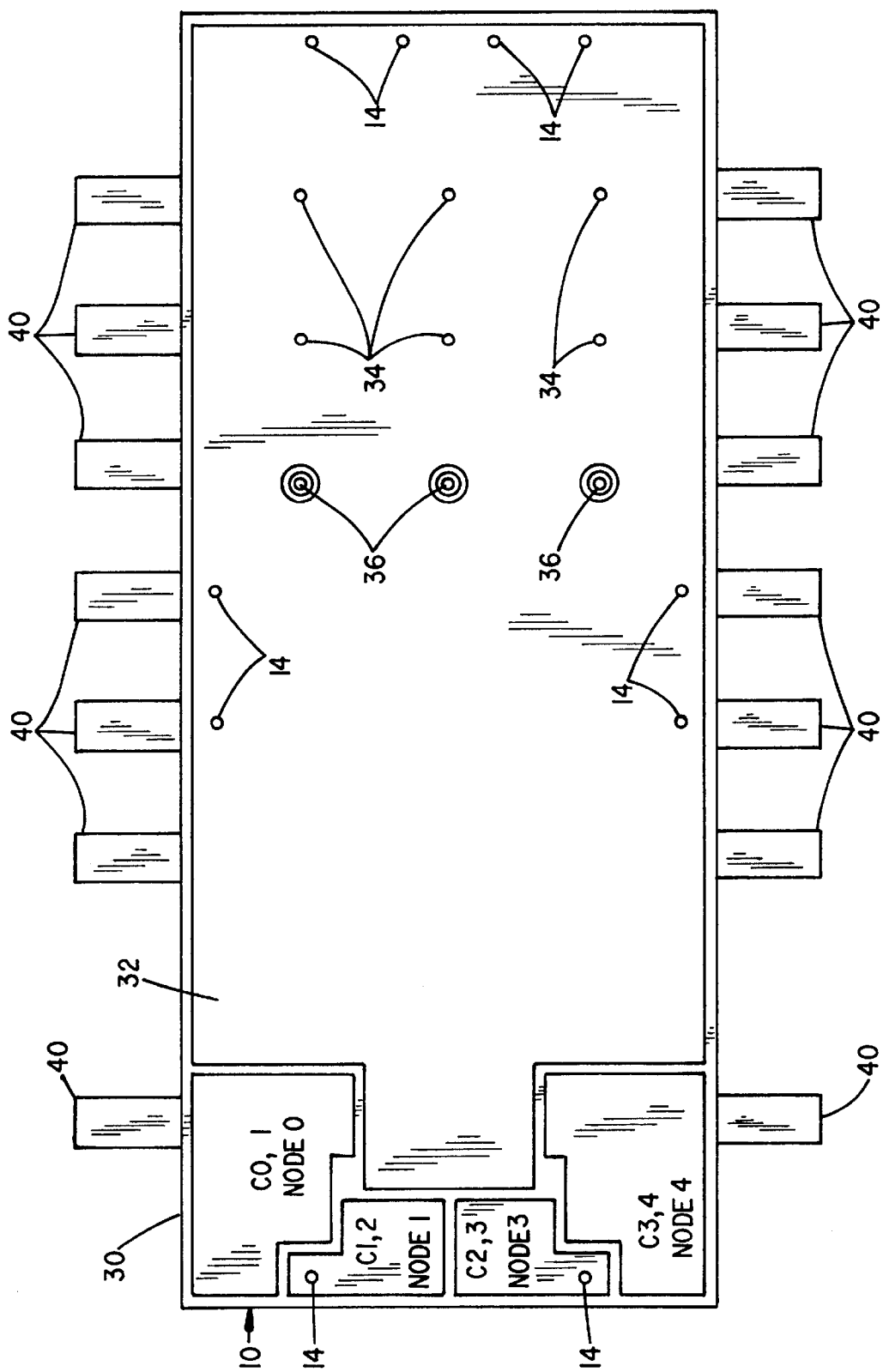
FIG. 7 is a plan view of the bottom termination layer of the filter of FIG. 3.
Figure 10:
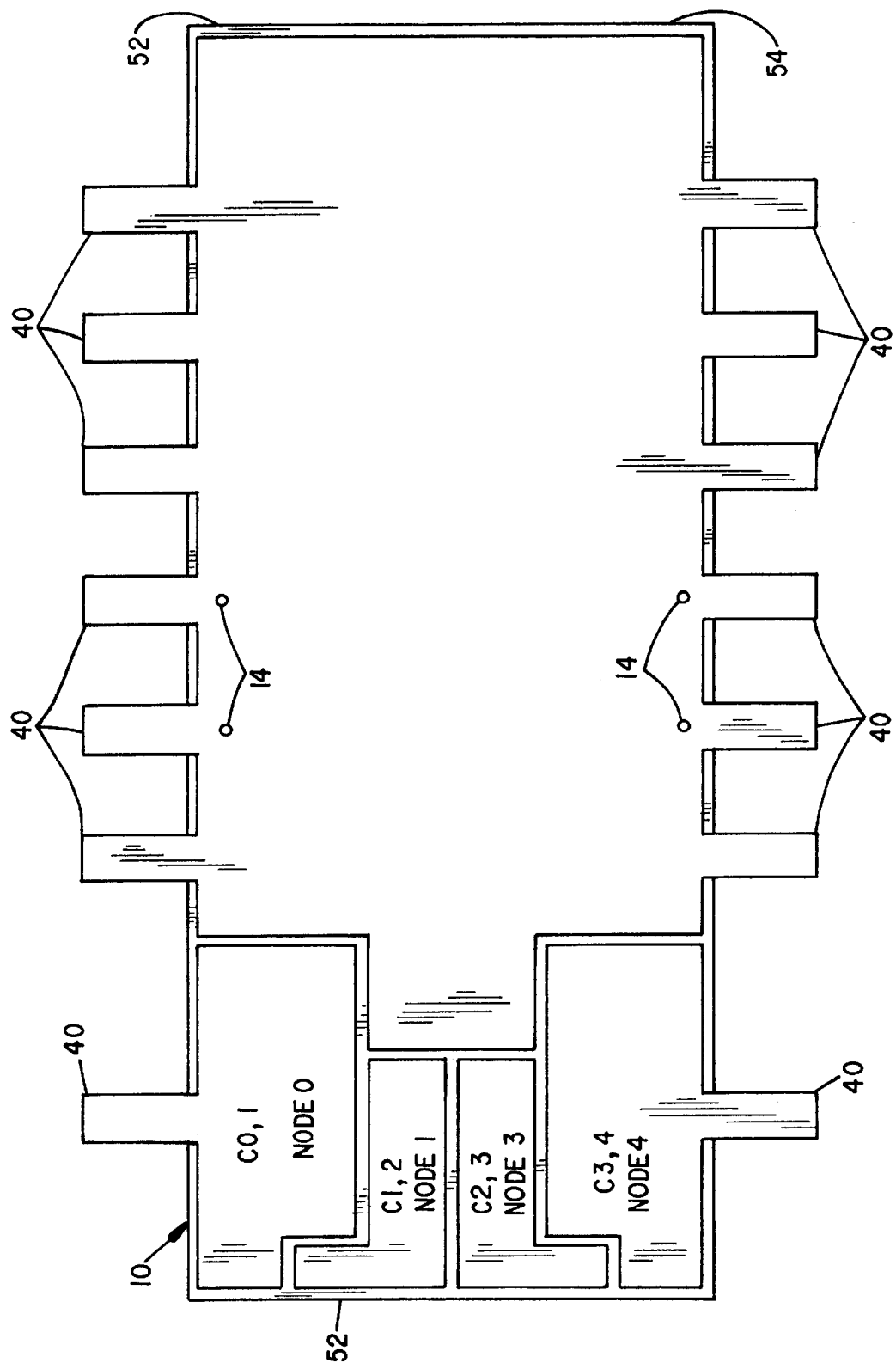
FIG. 10 is a plan view of the bottom termination layer of the filter of FIG. 9.

Returning attention to FIG. 3, the filter circuit 4 is shown in exploded assembly on ceramic substrates 8 and 10. The substrates are approximately 5.0 mm wide×12.4 mm long. Not shown are the associated cover layers that include the circuit termination pads. The construction of the latter layers depends upon the mounting configuration of the circuit package (e.g. multi-pin, surface mount, gull wing etc.). FIGS. 7 and 10 disclose exemplary terminations for the filters 2 and 6. Otherwise, the substrate 8 defines the coupling capacitors and one ground plane and the substrate 10 defines a resonator layer and second ground plane layer.

Figure 4:
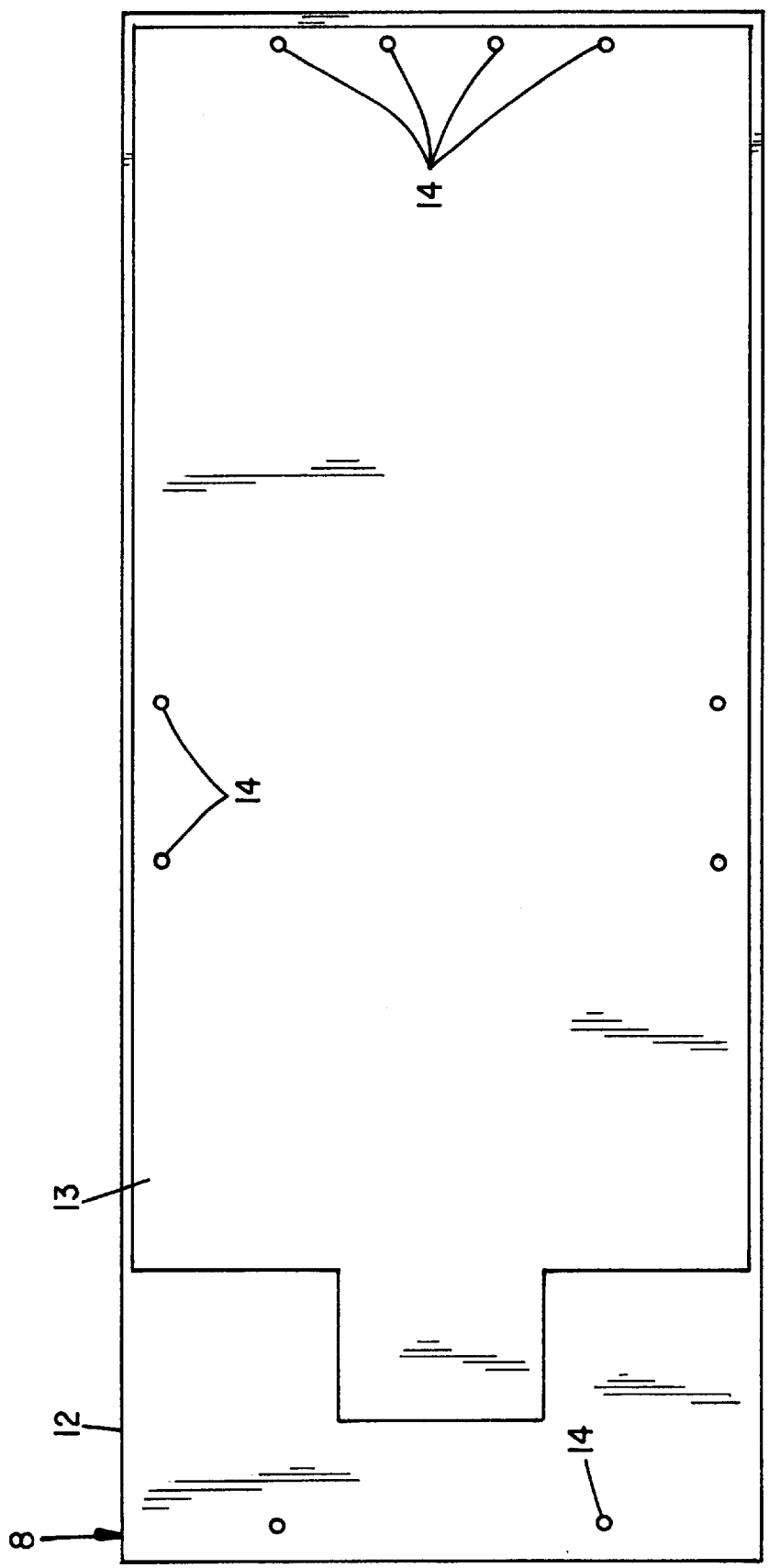
FIG. 4 is a plan view of the top ground cover layer of the filter of FIG. 3.

The specific configuration of the thin film depositions at the substrates 8 and 10 that determine the circuit elements and operating characteristics of the filter 2 are shown in detail at the plan views of FIGS. 4 through 7. FIG. 4 shows the top ground layer 12 and ground plane 13 and through which a number of holes or vias 14 extend. The ground plane 13 overlies the active resonant components Z1–Z3. The vias 14 are positioned to selectively align with other vias and depositions at the other layers. Upon stacking the substrates 8 and 10 and any other stacked substrates (not shown) and filling the previously plated vias 14 with solder, the vias 14 connect the circuit elements as shown at FIGS. 1 and 2.

Figure 5:
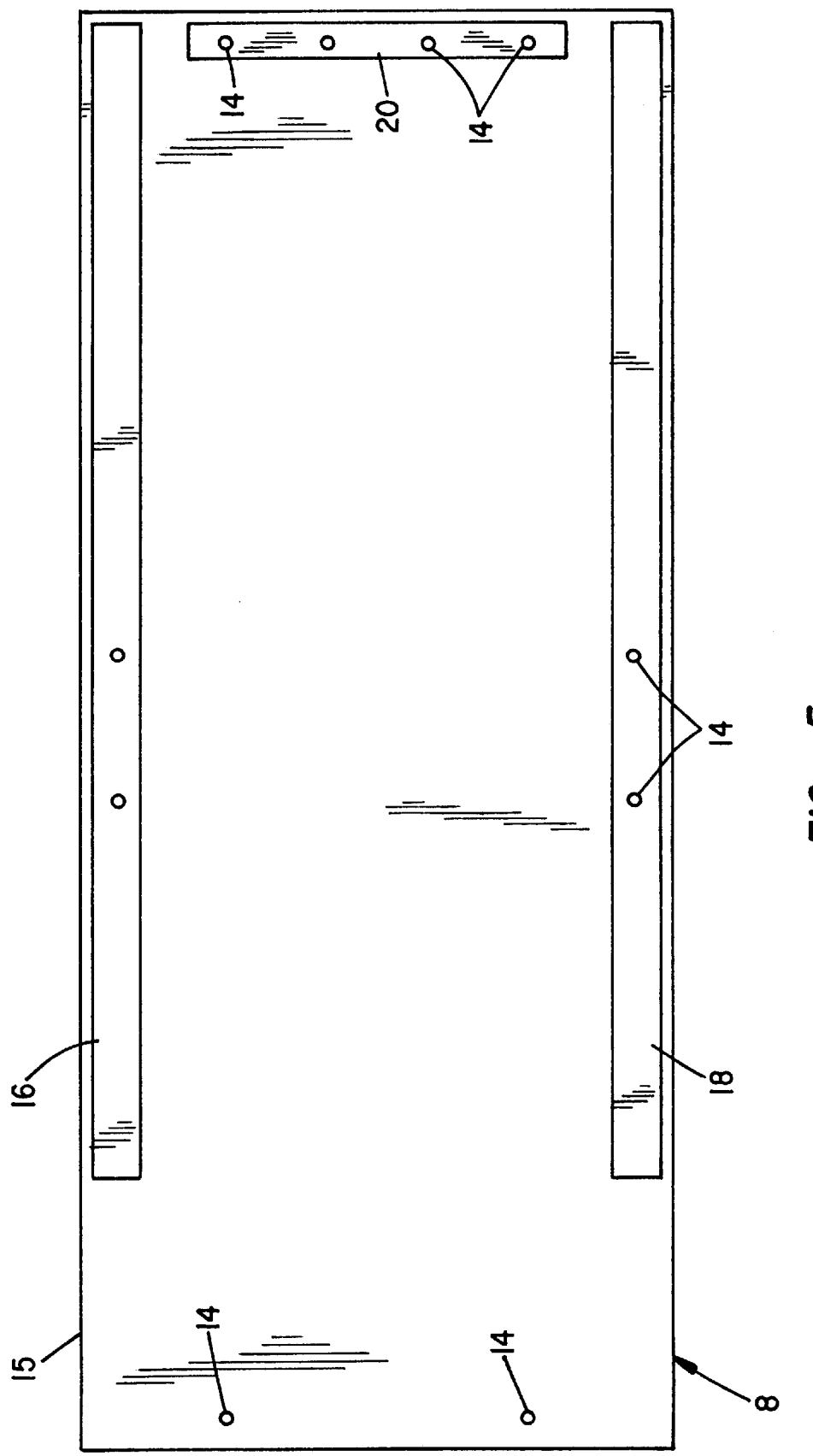
FIG. 5 is a plan view of the top strip line layer of the filter of FIG. 3.
Figure 6:
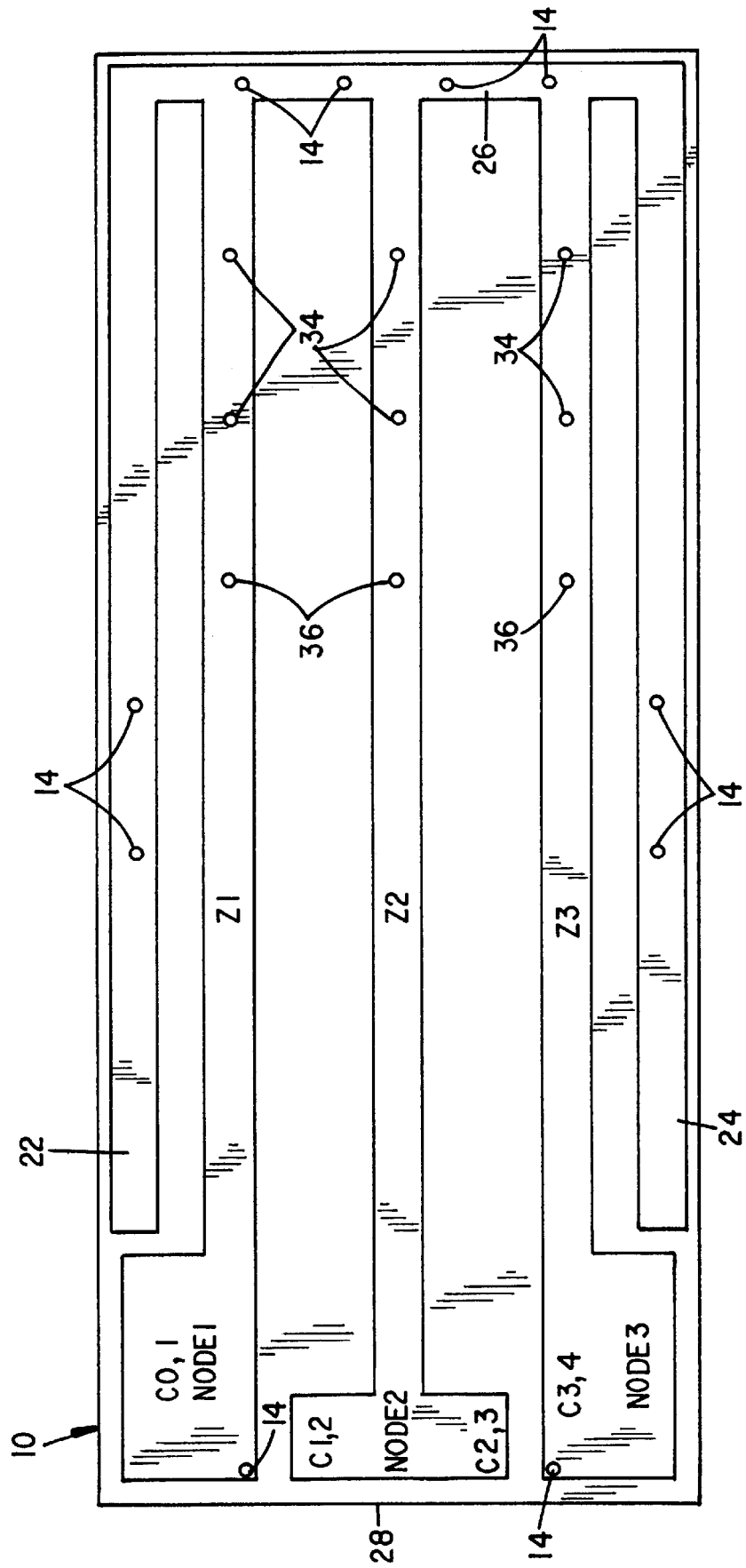
FIG. 6 is a plan view of the resonator layer of the filter of FIG. 3.

FIG. 5 depicts a strip line layer 15 and number of strip conductors 16, 18 and 20 that are formed on the lower surface of the substrate 8. The conductors 16, 18 and 20 are electrically connected by redundant through vias 14 to the ground plane 12 and to strip conductors 22, 24 and 26 at the resonator layer 28 shown at FIG. 6. An intermediate dielectric material (not shown) separates the layers 15 and 28. The coupled strip conductors 16–26 border and shield the distributed impedance elements Z1, Z2 and Z3 at the resonator layer 28 of the substrate 10. The conductors 16–26 and impedance elements Z1–Z3 are each approximately 400 microns wide. The impedance elements Z1–Z3 are also approximately 9.9 mm long.

Nodes 1–3 at the ends of the distributed impedance elements Z1–Z3 define one plate of the coupling capacitors C1–C4. The opposite plates of the coupling capacitors C1–C4 are defined by nodes 0–4 at the bottom termination layer 30, reference FIG. 7. Vias 14 extend between the nodes at the layers 28 and 30 to interconnect the distributed capacitors. A bottom ground plane 32 aligns to the active resonant components Z1–Z3. A number of vias 34 provided at the layers 28 and 30 redundantly connect the impedance elements Z1–Z3 to the ground plane 32. Isolated vias 36 connect the impedance elements Z1–Z3 to the capacitors C1–C4 and provide test points.

Termination pads 40 extend from the ground plane 32 and nodes 0 and 4 and connect with terminals, solder pads etc. at the device packaging. The termination pads 40, many of which are redundant, accommodate a 16-pin package. The number and location of the termination pads 40 is adjusted in relation to the number of substrates 8 and 10 at each filter circuit. That is and depending upon the filter circuit, multiple groupings of the substrates 8 and 10 can be stacked on top of each other and appropriate vias 14, 34 and 36 can be provided to obtain necessary circuit couplings.

Figure 8:
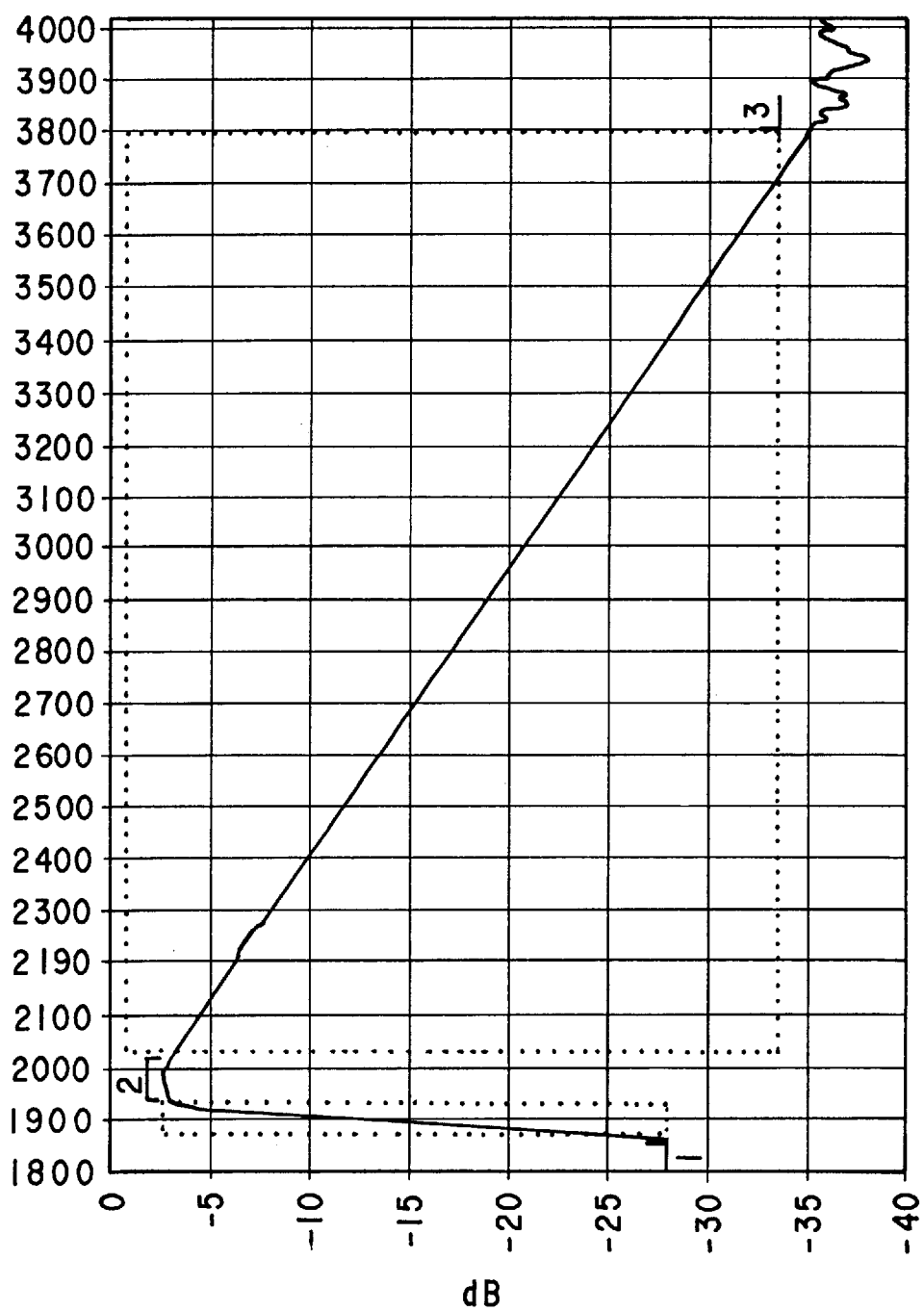
FIG. 8 is a plot of an exemplary frequency response of the filter of FIG. 3.

FIG. 8 shows a plot of the operating frequency to DB response characteristic of the filter 2. The circuit 2 particularly provides narrow band-pass operation centered at 1.95 GHz.

FIGS. 9 and 10 depict a resonator layer 50 and termination layer 52 of the 800 MHz band-pass filter 6. The layers 50 and 52 are constructed on substrates of comparable dimension to the substrates 8 and 10. The lumped impedance components Z1–Z3 are bordered by strip conductors 22, 24 and 26. The lumped impedance depositions Z1–Z3 extend as serpentine patterns from the nodes 1–3 to the strip conductor 26. The windings are 100 microns wide and the spacing between windings is 100 microns. The meandering pathway of the serpentine patterns is defined to provide a compact low-frequency construction. The layer 52 provides a ground plane 54 that is duplicated at the overlying substrate 8 (not shown). The nodes 0–4 are sized to reflect necessary capacitance values for the desired filter operating frequency.

Although not shown, the ground cover and strip line layers of the substrate 8 for the filter 6 are essentially identical to the layers 13 and 15, except for the size of the strip conductors 16–20 and ground plane 13.

The filters 2 and 6 demonstrate two substantially identical organizations. Depending upon possible ranges of the center and side band frequencies, the various thin film depositions at the layers of the substrates 8 and 10 can be constructed to a preferred oversize condition reflective of an extreme frequency of a relative range of frequencies. The depositions can later be laser trimmed to a desired final size to accommodate other frequencies and operating characteristics for limited volume production runs. Advantageously, the processing time to fabricate the filters can thereby be reduced and simplified to merely trimming, stacking and final packaging the trimmed substrates. Production inventories can thereby be reduced and response time to meet customer needs for tailored filters can be met.

Figure 11:
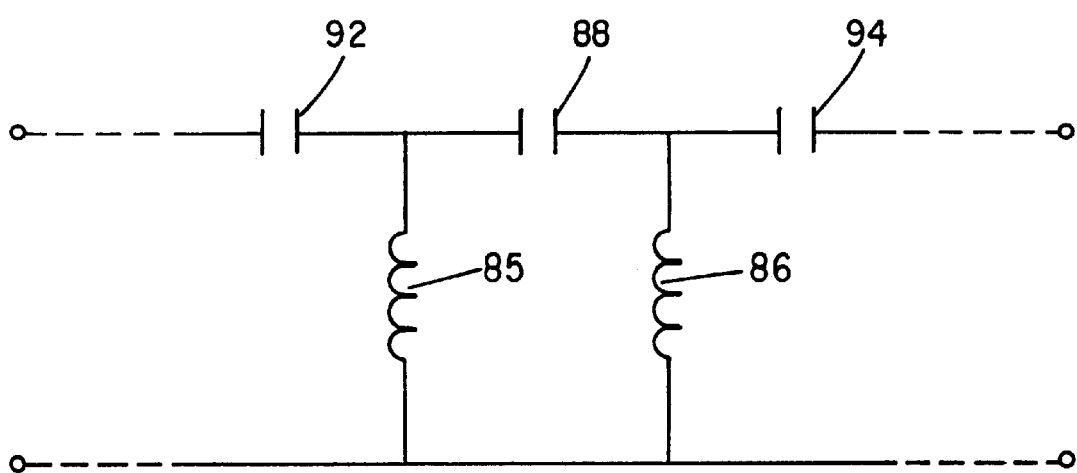
FIG. 11 is a circuit diagram to the circuit of FIG. 12.
Figure 12:
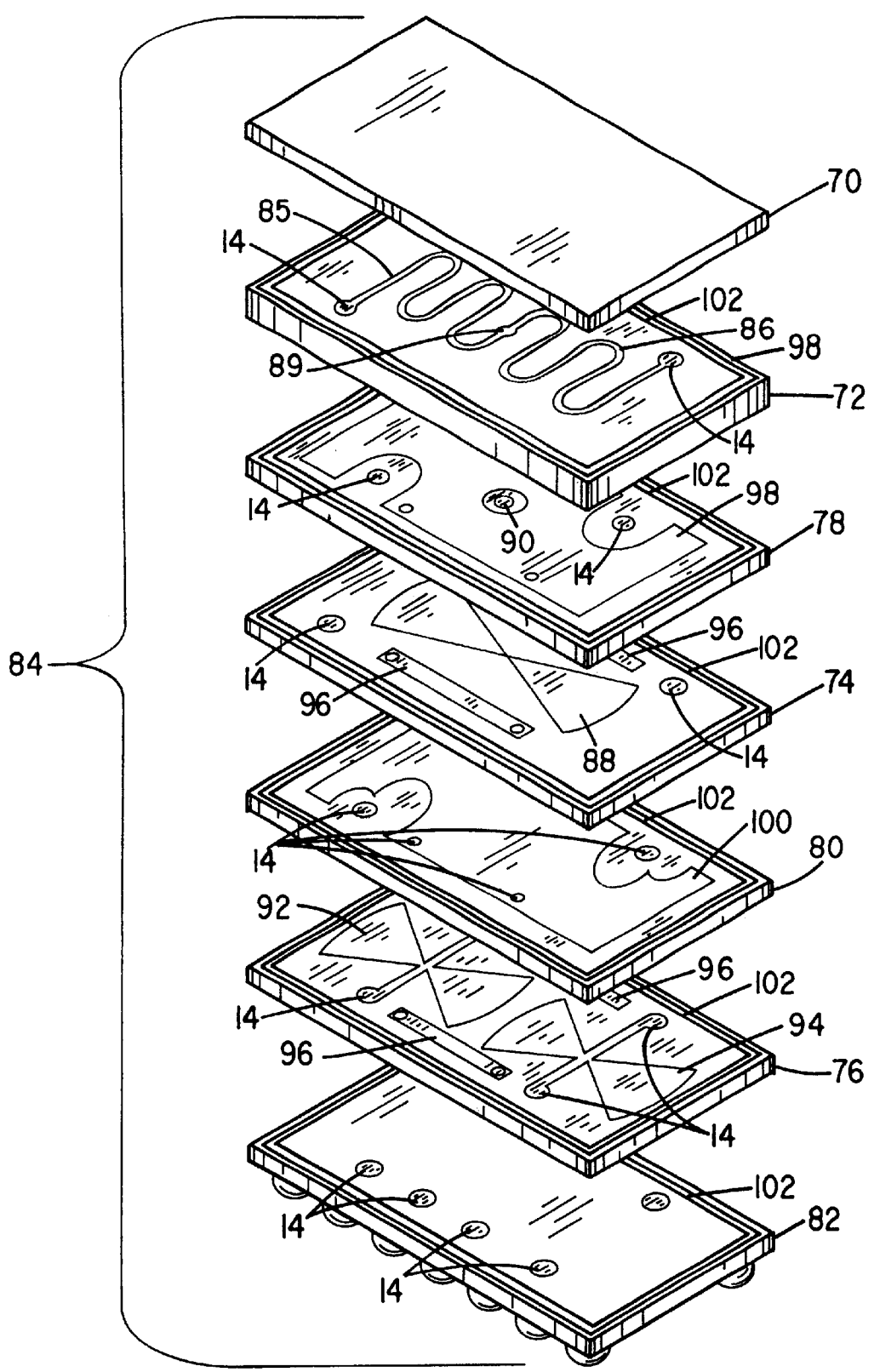
FIG. 12 is a perspective view, shown in exploded assembly, to the cover layer, signal layers and ball grid array termination layer of another GHz band-pass filter.

FIG. 11 shows a circuit schematic of the multi-layer assembly shown in perspective view and exploded assembly at FIG. 12. FIG. 12 particularly shows the cover layer 70, signal layers 72, 74 and 76, ground plane layers 78 and 80 and the BGA termination layer 82 of another multi-layer ceramic microstrip, band-pass filter 84. The filter 84 operates at a nominal 1.0 gigahertz frequency. The layer 72 provides a pair of inductors 85 and 86 that are coupled to a butterfly capacitor 88 by through vias 89 and 90. Input and output capacitors 92 and 94 are provided at the layer 76. Ground-connect buss bars 96 are displaced to the sides of the capacitors 88, 92 and 94. Ground planes 98 and 100 are positioned between the signal layers 72, 74 and 76. Ground strip conductors 102 circumscribe the borders of each of the layers 72–82 and vias 14 interconnect the printed components at the layers.

Figure 13:
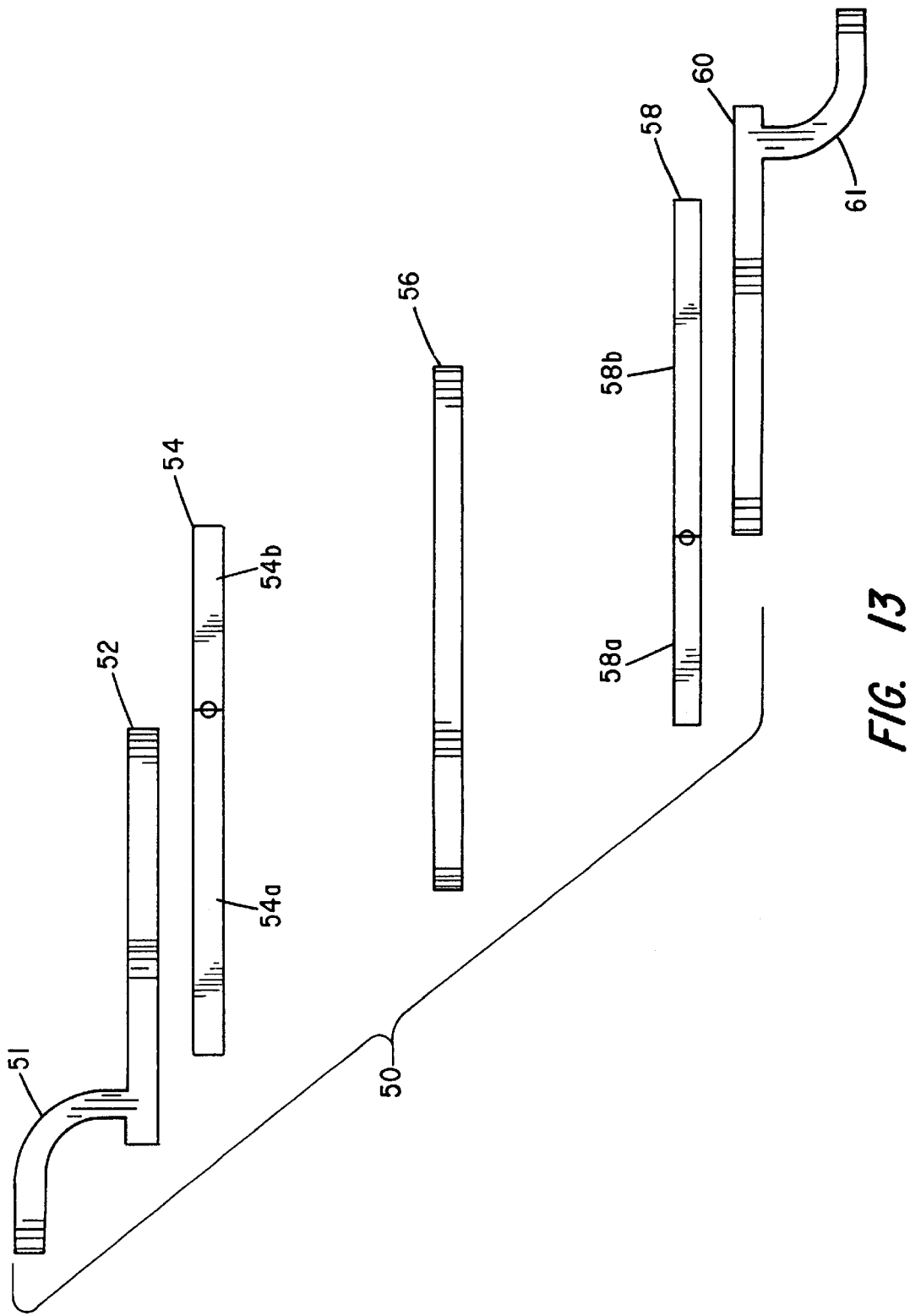
FIG. 13 is a composite layout schematic of the printed conductors of a nominal 2.1 GHz band pass filter delay line.
Figure 14:
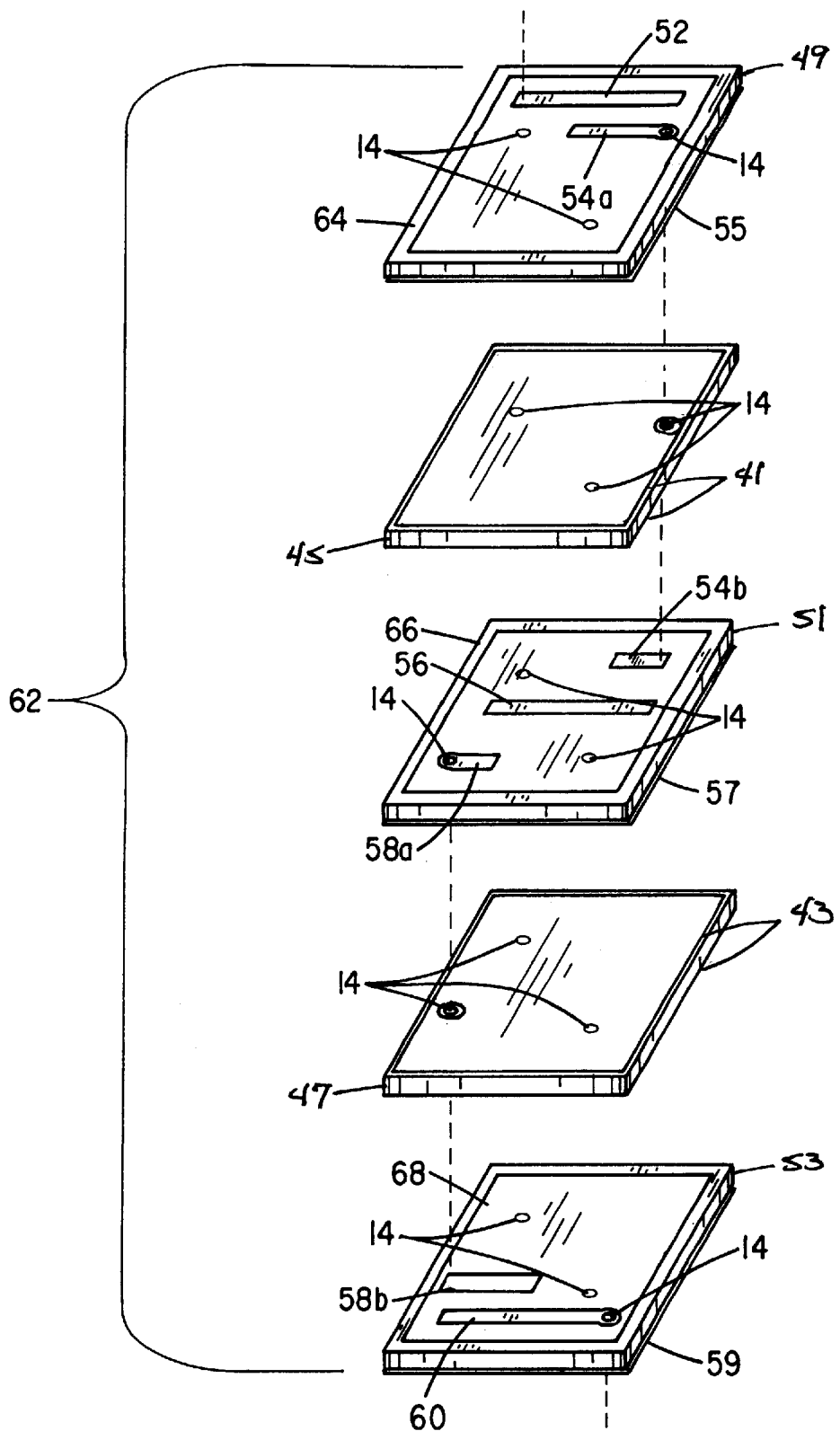
FIG. 14 is a perspective view, shown in exploded assembly, to the signal layers of the band pass filter of FIG. 13, exclusive of a cover layer and bottom termination layer.

FIGS. 13 and 14 depict another microstrip band pass filter 50 that when operated at 2.1 GHz acts as a nominal 14-nanosecond delay line. FIG. 13 depicts a composite view of the layout schematic of the printed conductors 52–60 of the circuit 50. The spacing and offset arrangement between the conductors 52–60 is configured to accommodate an operational coupling for the frequencies of interest at one quarter wavelength.

The physical multi-layer ceramic assembly 62 of the band pass filter 50 is shown in the exploded assembly at FIG. 14, exclusive of a cover layer and ball grid array (BGA) bottom termination layer. The latter cover and bottom termination layers are similar to those shown at FIG. 12. Vias 14 interconnect the segmented conductors 54a and 54b and 58a and 58b at the signal layers 49, 51 and 53 and the ground planes 55, 57 and 59. Ceramic dielectric layers 45 and 47 separate the signal layers 49, 51 and 53. Strip conductors 64, 66 and 68 circumscribe the borders of the signal layers 49, 51 and 53. Strip conductors 41 and 43 also circumscribe the borders of the dielectric layers 45 and 47 and facilitate packaging. That is, the strip conductors bond to the adjacent ground planes and strip conductor of each adjacent layer to provide a hermetic seal when the assembly is finally packaged. Arcuate coupling leads 51 and 61 are shown in FIG. 13 that are used as required depending upon the patterning of the signal layers relative to the termination layer and are not present in the layout arrangement of FIG. 14.

While the invention has been described with respect to a number of presently preferred circuit components and assembly constructions, it is to be appreciated still other constructions may be suggested to those skilled in the art. The scope of the invention should therefore be construed broadly within the spirit and scope of the following claims.

What is claimed is:

1. Modular thin film filter apparatus comprising:
    a) a plurality of signal layers, each including at least one distributed impedance signal conductor deposited on a first surface of a dielectric substrate and wherein a ground strip conductor circumscribes each of said signal conductors at said first surface;
    b) a plurality of ground plane layers, each including a conductor deposited on a first surface of a dielectric substrate to substantially cover the first surface, wherein a ground strip conductor circumscribes said ground plane conductors at said first surface, and wherein said ground plane layers are interleaved between said plurality of signal layers such that the thickness of a substrate separates each signal conductor and ground plane conductor from each signal conductor and ground plane conductor at an adjoining layer;
    c) a plurality of apertures that extend through each of said substrates and are displaced about said signal and cover layers and aligned to couple said signal conductors, said ground strip conductors and said ground plane conductors together; and
    d) termination means for coupling electrical signals to said signal conductors, said ground strip conductors, and said ground plane conductors.

2. Apparatus as set forth in claim 1 wherein the conductors at said signal and ground layers are sputtered onto ceramic substrates.

3. Apparatus as set forth in claim 1 wherein at least one of said signal conductors comprises a plurality of serpentine windings that define an inductor.

4. Apparatus as set forth in claim 1 wherein at least one of said signal conductors is a butterfly shaped and defines a capacitor.

5. Apparatus as set forth in claim 1 wherein said signal conductors, said ground strip conductors and said ground plane conductors are coupled together to define a bandpass filter circuit.

6. Modular thin film filter apparatus comprising:
    a) a first signal layer including at least one distributed impedance inductive signal conductor deposited on a first surface of a dielectric substrate having a plurality of serpentine windings that define an inductor and wherein a ground strip conductor circumscribes said inductive signal conductor;
    b) a plurality of second signal layers, each including at least one distributed impedance capacitive signal conductor deposited on a first surface of a dielectric substrate having a butterfly shape that defines a capacitor and wherein a ground strip conductor circumscribes said capacitive signal conductor;
    b) a plurality of ground plane layers, each including a conductor deposited on a first surface of a dielectric substrate to substantially cover the first surface, wherein a ground strip conductor circumscribes said ground plane conductors at said first surface, and wherein said ground plane layers are interleaved between said first and second signal layers such that the thickness of a substrate separates each of said inductive and capacitive signal conductors and ground plane conductors from each adjoining layer;
    c) a plurality of apertures that extend through each of said substrates and are displaced about said first and second signal and ground plane layers and aligned to couple said inductive and capacitive signal conductors, said ground strip conductors and said ground plane conductors together; and
    d) termination means for coupling electrical signals to said signal conductors, said ground strip conductors, and said ground plane conductors together to define a band pass filter circuit.

* * * * *